US009209653B2

(12) United States Patent
Maynard et al.

(10) Patent No.: US 9,209,653 B2
(45) Date of Patent: Dec. 8, 2015

(54) MAXIMIZING LIFE OF CAPACITORS IN SERIES MODULES (75) Inventors: Xavier Maynard, Saint Genis Laval (FR); Andre Milewski, Jarnioux (FR); Gianni Sartorelli, Oppens (CH); Mikael Setterberg, La Jolla, CA (US)

(73) Assignee: Maxwell Technologies, Inc., San Diego, CA (US)

( * ) Notice: Subject to any disclaimer, the term of this patent is extended or adjusted under 35 U.S.C. 154(b) by 363 days.

(21) Appl. No.: 13/806,085

(22) PCT Filed: Jun. 28, 2011

(86) PCT No.: PCT/US2011/042239
§ 371 (c)(1),
(2), (4) Date: Dec. 20, 2012

(87) PCT Pub. No.: WO2012/006115
PCT Pub. Date: Jan. 12, 2012

(65) Prior Publication Data
US 2013/0093400 A1  Apr. 18, 2013

(30) Foreign Application Priority Data
Jun. 28, 2010  (FR) ...................................... 10 55134

(51) Int. Cl.
*H02J 7/00* (2006.01)
*H02M 3/06* (2006.01)
(Continued)

(52) U.S. Cl.
CPC ............... *H02J 15/00* (2013.01); *G01R 31/362* (2013.01); *H02J 7/0016* (2013.01); *H02J 7/345* (2013.01)

(58) Field of Classification Search
CPC ........... H02J 7/00; H02J 7/0016; H02J 7/345; H02J 15/00; H02M 3/06; H01M 4/06; G01R 31/362
USPC ............................. 320/166; 307/109; 363/59
See application file for complete search history.

(56) References Cited

U.S. PATENT DOCUMENTS 4,446,513 A * 5/1984 Clenet ........................... 363/132
4,957,091 A   9/1990 Remmers
(Continued)

FOREIGN PATENT DOCUMENTS

CN  101095275 A  12/2007
EP  305347  3/1989
(Continued)

OTHER PUBLICATIONS

Basu, Supratim, "Voltage and Current Ripple Considerations for Improving Ultra-Capacitor Lifetime While Charging with Switch Mode Converters," Power Electronics and Applications (2007) 1-7.

*Primary Examiner* — Phallaka Kik
(74) *Attorney, Agent, or Firm* — Knobbe Martens Olson & Bear LLP (57) ABSTRACT

A device (1) monitors and/or balances an ultracapacitor (3) and/or a module (4) comprising a plurality of ultracapacitors (3) connected in series, the module (4) being connectable in series or in parallel with other modules (4). The device comprises an electronic board (2) comprising digital control and/or command means, such as a microcontroller (5), executing a program for monitoring and balancing the ultracapacitor (3) and/or the module (4). The relative capacitances of the capacitors are measured, and this information is employed to determine when to carry out a controlled discharge of particular capacitors. Temperature information is also employed to determine when to carry out a controlled discharge of particular capacitors. In this way the lifetime of any particular capacitor is, desirably, extended to be no shorter than the lifetime of other longer-lived capacitors in the module.

12 Claims, 3 Drawing Sheets

(51) Int. Cl.
*H01M 4/06* (2006.01)
*H02J 15/00* (2006.01)
*G01R 31/36* (2006.01)
*H02J 7/34* (2006.01)

(56) References Cited

U.S. PATENT DOCUMENTS

| | | | |
|---|---|---|---|
| 5,041,776 A | 8/1991 | Shirata et al. | |
| 5,146,095 A | 9/1992 | Tsuchiya et al. | |
| 5,199,394 A | 4/1993 | Hartmann et al. | |
| 5,256,956 A | 10/1993 | Tsuchiya et al. | |
| 5,325,042 A | 6/1994 | Murugan | |
| 5,387,859 A | 2/1995 | Eckenfelder et al. | |
| 5,539,388 A | 7/1996 | Modgil | |
| 5,563,454 A | 10/1996 | Araki et al. | |
| 5,834,924 A * | 11/1998 | Konopka et al. | 323/222 |
| 6,038,149 A * | 3/2000 | Hiraoka et al. | 363/37 |
| 6,066,936 A | 5/2000 | Okamura et al. | |
| 6,075,378 A | 6/2000 | Okamura | |
| 6,362,595 B1 | 3/2002 | Burke | |
| 6,407,593 B1 | 6/2002 | Kawamoto et al. | |
| 6,420,793 B1 | 7/2002 | Gale et al. | |
| 6,788,027 B2 | 9/2004 | Malik | |
| 6,819,010 B2 | 11/2004 | Burke | |
| 6,861,767 B2 | 3/2005 | Amano et al. | |
| 6,888,266 B2 | 5/2005 | Burke et al. | |
| 6,988,476 B2 | 1/2006 | Solberg | |
| 7,078,825 B2 | 7/2006 | Ebrahim et al. | |
| 7,198,016 B2 | 4/2007 | Burke | |
| 7,319,306 B1 | 1/2008 | Rydman et al. | |
| 7,342,755 B1 * | 3/2008 | Horvat et al. | 361/18 |
| 7,395,810 B2 | 7/2008 | Miyashita et al. | |
| 7,471,068 B2 | 12/2008 | Cegnar | |
| 7,573,151 B2 | 8/2009 | Acena et al. | |
| 7,592,782 B2 | 9/2009 | Rydman et al. | |
| 7,690,343 B2 | 4/2010 | Doljack | |
| 7,806,095 B2 | 10/2010 | Cook et al. | |
| 2001/0022510 A1 * | 9/2001 | Okamura et al. | 320/166 |
| 2002/0024322 A1 | 2/2002 | Burke | |
| 2002/0093313 A1 * | 7/2002 | Hoffmann et al. | 320/166 |
| 2003/0067281 A1 | 4/2003 | Wilk et al. | |
| 2005/0083020 A1 * | 4/2005 | Baarman | 320/166 |
| 2005/0180074 A1 * | 8/2005 | Doljack et al. | 361/58 |
| 2007/0141411 A1 | 6/2007 | Meredith et al. | |
| 2007/0216343 A1 | 9/2007 | Rozman et al. | |
| 2007/0217235 A1 * | 9/2007 | Quazi | 363/89 |
| 2008/0013224 A1 * | 1/2008 | Kim et al. | 361/16 |
| 2008/0024079 A1 * | 1/2008 | Matsubara et al. | 318/376 |
| 2008/0106239 A1 * | 5/2008 | Cegnar | 320/167 |
| 2008/0114501 A1 | 5/2008 | Wu | |
| 2008/0136374 A1 | 6/2008 | Nelson et al. | |
| 2008/0297231 A1 | 12/2008 | Riedel | |
| 2009/0050092 A1 | 2/2009 | Handa et al. | |
| 2009/0056661 A1 | 3/2009 | Cook et al. | |
| 2009/0184692 A1 | 7/2009 | Owens et al. | |
| 2009/0261787 A1 | 10/2009 | Cegnar et al. | |
| 2010/0194351 A1 | 8/2010 | Nagashima et al. | |
| 2010/0231167 A1 * | 9/2010 | Ohnuki | 320/119 |
| 2011/0121793 A1 | 5/2011 | Liu | |
| 2011/0248670 A1 | 10/2011 | Yamazaki et al. | |
| 2012/0299557 A1 * | 11/2012 | Kwon et al. | 320/166 |

FOREIGN PATENT DOCUMENTS

| | | | | |
|---|---|---|---|---|
| EP | 490088 | 6/1992 | | |
| EP | 1013506 | 11/2004 | | |
| EP | 2 112 739 | 10/2009 | | |
| EP | 2 128 960 | 12/2009 | | |
| EP | 2159409 | 3/2010 | | |
| GB | 2 452 130 | 2/2009 | | |
| JP | 03194480 A * | 8/1991 | | G01R 31/30 |
| JP | Hei 09-308119 | 11/1997 | | |
| JP | 2008-35674 | 2/2008 | | |
| WO | WO 90/05405 | 5/1990 | | |
| WO | WO 90/06429 | 6/1990 | | |
| WO | WO 2009/055809 | 4/2009 | | |
| WO | WO 2009/092848 | 7/2009 | | |

* cited by examiner

MAXIMIZING LIFE OF CAPACITORS IN SERIES MODULES

BACKGROUND

Capacitors, particularly ultracapacitors and supercapacitors, have in recent years come to be used in a variety of high-power applications, and in particular offer synergies when used with electrochemical cells. Capacitors used in such applicants are generally deployed in series modules, each series module containing some fixed number of capacitors in series.

In a series module of capacitors, if one capacitor fails much earlier than its neighbors, then probably the module has to be taken out of service. It would be very desirable if the life of each capacitor could somehow be made to match that of the longest-lived of its neighbors.

Likewise in a system having several series modules of capacitors, if one module fails much earlier than its neighbors, then probably the failed module has to be taken out of service. It would be very desirable if the life of each module could be made to match that of the longest-lived of its neighbors.

Enormous amounts of time and effort have been expended toward such ends, with only limited success. As one example, an effort can be made to measure characteristics of such capacitors (such as the precise capacitance) and to "bin" them, that is, to group capacitors (to place them in bins) according to the measured characteristics. After the capacitors have been binned, then each module is fabricated using capacitors from a single bin. Although binning can be helpful, it does not come anywhere close to solving the problem, for a number of reasons including that later events can age one capacitor faster than another.

Large amounts of time and effort have likewise been expended toward trying to bring about similar results for electrochemical cells, with varying degrees of success. It is tempting to imagine that any approach that helps with electrochemical cells would help equally with capacitors, and vice versa. But there are many differences between capacitors and electrochemical cells that make it impossible to assume such a thing. Cell-life models are non-identical as between electrochemical and electrostatic cells, for one thing. The relationship between the stored charge and the voltage is generally nearly linear for capacitors and is decidedly extremely nonlinear for electrochemical cells, for another.

References of possible historical interest include the following patents and published patent applications: U.S. Pat. No. 5,479,083 to Brainard, U.S. Pat. No. 5,952,815 to Rouillard, U.S. Pat. No. 5,764,037 to Jacobs, U.S. Pat. No. 5,713,426 to Okamura, U.S. Pat. No. 6,087,799 to Turner, U.S. Pat. No. 3,602,795 to Gunn, U.S. Pat. No. 5,726,552A to Okamura, U.S. Pat. No. 5,063,340A to Kalenowsky, EP1081824 to Rufer, US 2008/197806 to Ridder, US2008/0272735A1 to Roessler, WO2007/145460A1 to Oh, WO2007/145463A1 to Oh, WO2007/145464A1 to Oh, US2004/251934 to Yano, US2006/221516 to Daboussi, US2007/001651 to Harvey, DE10 2008 056962 A1 to Herke, and EP1035627 A1 to Ohta.

Experience has shown that the aging of an ultracapacitor, defined or characterized by the diminution of its capacity and and by an increase of its internal resistance, is accelerated by the voltage applied at its terminals, by its temperature rise during its charge, by its ambient temperature inside the module. Stated differently, cell-life models have been developed which depend at least in part upon a history of applied voltages and upon a history of cell temperatures.

The alert reader will thus appreciate that it may be very helpful to monitor the temperature and voltage, to the extent possible, and to control, to the extent possible, the voltage load imposed upon each of the ultracapacitors. In an assembly of modules connected in series or in parallel, these factors can differ, on the one hand, between the different modules making up the assembly and, on the other hand, between the different ultracapacitors making up a particular module. It would be desirable to attempt to make the factors uniform inside of a module, and between modules, to prevent the premature aging of an ultracapacitor causing the premature aging of a module causing, in turn, the premature aging of an assembly.

Known approaches toward these ends, particularly that of controlling the voltage at the terminals of an ultracapacitor during its charge, include:
  passive balancing;
  clipping from a predetermined voltage value close to the maximum voltage specified for the ultracapacitor; and
  voltage or charge balancing of an ultracapacitor with respect to the neighboring ultracapacitors.

These last two techniques typically use analog electronic boards. One drawback of any analog electronics associated with ultracapacitors is that it typically is not capable of self-diagnosis. The more complicated the system, the greater the number of components, which implies a reduced average time between failures for the analog electronics.

It will be recalled that in a capacitor, the relationship between stored charge Q and voltage V is (within some dynamic range) very nearly linear, the coefficient being C in the equation $Q=CV$. We can use this equation to model a particular case where a number of ultracapacitors are in series within a module. From Kirchhofs Law we know that in a simple charging regime, the current through each capacitor in the series string is the same, and thus charge imparted to each capacitor in the series string (being the time integral of the current) is the same. If each capacitor were to have a capacitance C identical to that of its neighbors, then at any given instant we would expect each capacitor to have very nearly the same voltage accumulated upon it.

Now let us assume for sake of discussion that one ultracapacitor within the module has come to have a capacity lower than the average capacity of the other ultracapacitors in the module. If we then assume one or more cycles of a charging current and a discharging current, then the voltage on the low-capacity cell will tend to rise higher on the charges and fall lower on the discharges.

As mentioned above it has been attempted to provide a balancing device with such a series capacitive array. The balancing device may follow a simple algorithm, for example to discharge (to some extent) any capacitor which, at a given moment, is at a higher voltage than the average for the module. The practical result is that for a particular capacitor that is of lower-than-average capacitance, it will get discharged when it is at a high voltage; likewise for a particular capacitor that is of higher-than-average capacitance, it will get discharged when it is at a low voltage. This leads to a useless energy dissipation.

Another approach that has been attempted is simply to control (and to limit) the voltage applied to the module by the circuitry that charges it up. A related but distinct approach that has likewise been attempted is simply to control (and to limit) the amount of charge applied to the module by the circuitry that charges it up. These two approaches affect all of the ultracapacitors of the module, and do not take into account any non-identical characteristics of cells in the module.

SUMMARY OF THE INVENTION

An exemplary embodiment of a system according to the invention provides an electronic board comprising digital control and/or command means such as a microcontroller executing a program for the monitoring and/or balancing of the ultracapacitors within a module or of the modules within a system, or both. The electronics, operated as discussed hereinbelow, make it possible to implement end-of-charge protocols more adapted to voltage control at the terminals of each of the ultracapacitors and based on the circumstances of a particular ultracapacitor, rather than on the principle of raising and lowering the voltage load of the ultracapacitors by a converter. Furthermore, the microcontroller allows for making analog acquisitions, controlling an active balancing of the ultracapacitors, communicating with other modules placed in series or in parallel, memorizing defects, or even memorizing operation data enabling the creation of statistics.

According to an embodiment, the electronic board comprises several means for the analog formatting of signals originating from at least one group among the plurality of ultracapacitors comprised in the module. This provision allows for adapting the signals originating from ultracapacitors to the different components of the electronic board so they can be used. Advantageously, the ultracapacitors form groups comprising each of the ultracapacitors arranged alternately with respect to the ultracapacitors of the other groups.

One way to accomplish balancing is to use passive balancing means. Such a passive balancing means of the module may comprise a resistor connected in parallel with each of the ultracapacitors of the module. This provision makes it possible to continually have a balancing means decreasing the largest voltage disparities at the terminals of the ultracapacitors for the highest voltages, and maintaining a balancing means for very low voltages, at which the electronic board can no longer function.

Another way to accomplish balancing is to use active balancing means. Such active balancing means directs itself to reduction of the voltage charge at the terminals of each capacitor, if it is too high. In an exemplary embodiment, a dissipative device such as a resistor is arranged in series with an active switch such as a transistor, both arranged in parallel with each of the ultracapacitors of the module. The microcontroller can then control the opening and closing of each transistor. The transistor may be a power transistor, for example a bipolar transistor of the NPN type. The balancing electronics may comprise an internal supply providing power to the electronics, drawing power from the ultracapacitors of the module.

If each module has its own balancing electronics, then where several modules are involved, each balancing electronics will have communications interface, preferably with galvanic isolation such as an optocoupler, allowing for communicating with the other balancing electronics which provide the monitoring and balancing of other modules. As will be described, each balancing electronics preferably has a non-volatile data storage means, permitting the monitoring over time of the service life of the ultracapacitors and of the module.

Within a given module, during charging of the module, the microcontroller of a balancing electronics controls the discharge of smaller-capacity ultracapacitors whose voltage is greater than the average of the voltage of the module calculated at high voltage.

To learn which capacitors are of smaller capacity, any of several algorithms can be put to use. With one algorithm, measurement takes place for a particular capacitor if the voltage amplitude at its terminals is greater than a threshold lying between 0.5 and 1 V. This provision makes it possible to detect a faulty module which has the misfortune to contain an ultracapacitor that is no longer charging adequately.

In one exemplary embodiment, each capacitor has a thermistor nearby to it, connected to the control electronics. In a second exemplary embodiment, each module has a thermistor nearby to it, connected to respective control electronics.

DESCRIPTION OF THE DRAWING

The invention will be described with respect to a drawing in several figures.

Where possible, like reference numerals have been employed among the figures to denote like elements.

DETAILED DESCRIPTION

Figure 1:
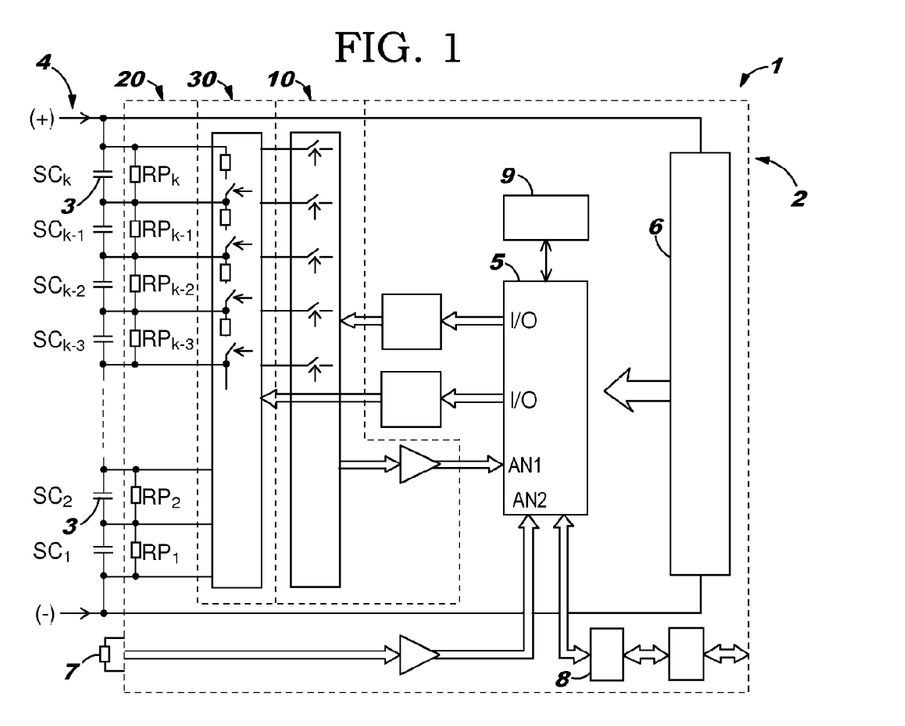
FIG. 1 shows, in a general manner, the wiring diagram of the different parts of a monitoring and balancing device according to the invention.

As shown in FIG. 1, a device 1 for monitoring and balancing a module 4 comprising a plurality of ultracapacitors 3 connected in series comprises an electronic board 2 (in dotted lines in the drawing).

This electronic board 2 comprises a microcontroller 5 supplied by an internal supply 6 providing the power supply necessary to the operating of the different components of the electronic board 2 by taking the supply power directly from the ultracapacitors 3 of the module 4.

The power consumption of this internal supply 6 is very small in order to discharge the ultracapacitors 3 as little as possible. The electronics board 2 may draw power from an external supply (omitted for clarity in FIG. 1), but in the absence of such external power, the electronic board 2 is thus mainly adapted to function only in cases where the ultracapacitors 3 have been charged at least beyond some threshold level.

The electronic board further comprises data storage means 9 connected to the microcontroller 5.

A thermistor 7 connected to the electronic board 2 is arranged in the vicinity of the module 4 to monitor its temperature. The signal originating from this thermistor 7 is formatted and connected to the AN2 input (an analog input) of the microcontroller 5.

The electronic board 2 comprises several parts having distinct functions:
  a first part 10 carrying out the multiplexing and the analog formatting of the signals originating from each of the ultracapacitors 3 of the module 4;
  a second part 20 carrying out the passive balancing of the ultracapacitors 3, and
  a third part 30 carrying out the active balancing of the ultracapacitors.

First part 10. The first part 10 is detailed in FIG. 2. Its purpose is to format the signals originating from each ultracapacitor 3 in order to measure the voltage at its terminals, as will now be described.

Figure 2:
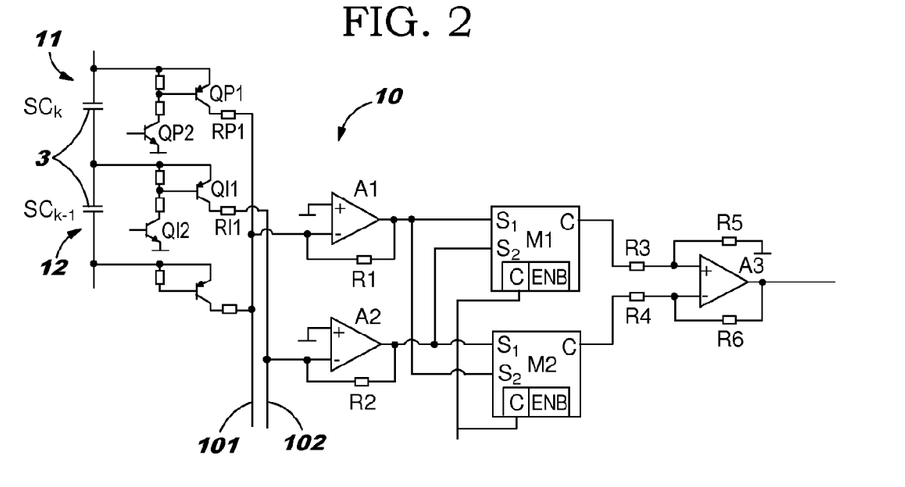
FIG. 2 gives a detail of the device of FIG. 1 dedicated to the analog conditioning of the signals originating from ultracapacitors.

For simplicity of description we assume an even number of capacitors 3, and we denote them as "odd" and "even" along the series string of capacitors.

Starting from a first group 11 of ultracapacitors 3 constituted by all the even ultracapacitors 3 of the module 4, a transistor QP1 in series with a resistor RP1 of a first ultracapacitor 3 of the first group 11 is directed toward a measurement line 101 referred to as "even" such as the entire assembly of transistors $QP_{2K}$ and resistor $RP_{2K}$ of the ultracapacitors 3 of the first group 11.

Similarly, starting from a second group 12 of ultracapacitors 3 constituted by all the odd ultracapacitors 3 of module 4, a transistor QI1 in series with a resistor RI1 of a first ultracapacitor 3 of the second group 12 is directed toward a measurement line 102 referred to as "odd", such as all the transistors $QI_{2K+1}$ and resistor $RI_{2K+1}$ of the ultracapacitors 3 of the second group 12.

For the "even" and "odd" measurement lines 101 and 102 to be representative of the voltage at the terminals of the ultracapacitors 3, respectively even and odd, transistors QP2 and QI2 are arranged, on the one hand to enable a differential measurement of voltage with the mass and, on the other hand, to communicate respectively with the transistors QP1 and QI1.

The base of the transistors QP2 and QI2 is connected to the microcontroller 5 which thus controls the measuring of voltage at the terminals of each ultracapacitor 3.

Each of the voltages originating from the "even" and "odd" measurement lines is buffered respectively by operational amplifiers A1 and A2 mounted as inverting amplifiers with an amplification ratio respectively proportional to the ratio R1/RP1 and R2/RI1.

The output of the operational amplifier A1 is then connected to an input S1 of a first analog multiplexer M1 and to an input S2 of a second analog multiplexer M2. Similarly, the output of the operational amplifier A2 is connected to an input S2 of the first analog multiplexer M1 and to an input S1 of the second analog multiplexer M2. Each multiplexer M1, M2 has an input C connected to an input C of the other multiplexer M1, M2. These two inputs C are connected to an output of the microcontroller 5 which allows for the reversal of polarity of the output voltages of the amplifiers A1 and A2 to be selected through a logic output signal I/O.

Therefore, for a logic signal equal to 0 at the inputs C of the two analog multiplexers M1 and M2, the output signal D of the analog multiplexer M1 is equal to the output signal A1, whereas the output signal D of the analog multiplexer M2 is equal to the output signal A2. Conversely, for a logic signal equal to 1 at the inputs C of the two analog multiplexers M1 and M2, the output signal D of the analog multiplexer M1 is equal to the output signal A2 whereas the output signal D of the analog multiplexer M2 is equal to the output signal A1.

The two output signals D of the two analog multiplexers M1 and M2 are then compared by means of an operational amplifier A3 configured as a subtractor. The output voltage of this subtractor is proportional to the difference of the signals originating from the analog multiplexer M1 and originating from the analog multiplexer M2.

This output voltage is representative of the voltage difference at the terminals of the ultracapacitors 3 existing at time t between the "even" ultracapacitors 3 and the "odd" ultracapacitors 3. This voltage is sent toward an A/D converter which sends the digitized signal back to the input AN1 of the microcontroller 5.

The values of these digital signals can be stored in the storage means 9 to be used later, particularly by the creation of statistics on the charge voltage swings of the two groups of ultracapacitors 3.

The voltage measure of the ultracapacitors can reach levels neighboring in the hundredths of a volt whereas the components A1, A2, A3, M1, and M2 are conventionally supplied with voltages between ±5V and ±15V.

Therefore, the attenuation ratios R1/RP1 and R2/RI1 are chosen to stay in this operational zone. The amplification ratios R5/R3 and R6/R4 reinstate the measuring scale of the ultracapacitors 3 at the output of the operational amplifier A3.

Second part 20. The second part 20 consists of arranging a resistor RPK in parallel with each ultracapacitor 3. This resistor is selected to be a very high resistance, so that the ultracapacitor 3 discharges only very slowly through this resistor RPK. In this way, even if the capacitors 3 are "run down", meaning that they do not carry a voltage high enough to power the electronics 10, 30, still some balancing can be carried out.

Third part 30. The third part is detailed in FIG. 3. This part relates to the active balancing between ultracapacitors $SC_K$ 3 based on the principle of discharge of the ultracapacitors 3 by a resistor $R_K1$.

Figure 3:
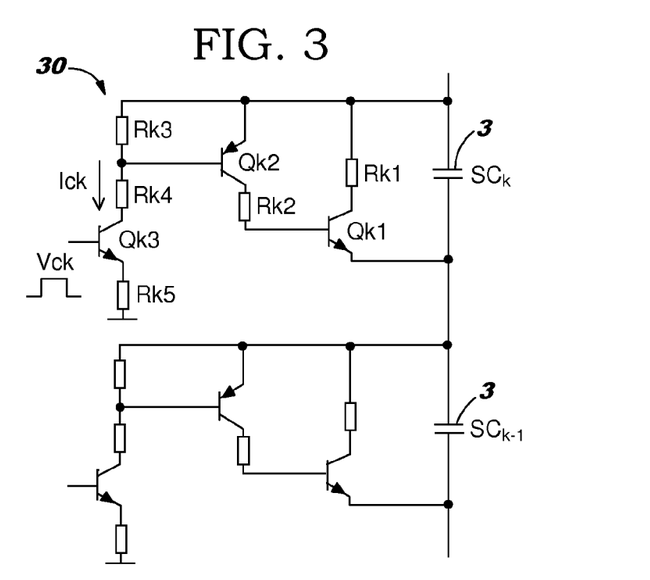
FIG. 3 gives a detail of the part of the device of FIG. 1 dedicated to active balancing.

In an exemplary embodiment this resistor $R_K1$ has a value of 5Ω and is switched in parallel of an ultracapacitor 3 by a power transistor $Q_K1$ of the NPN type configured as a switch.

The base current for the control of the transistor $Q_K1$ is taken directly from the ultracapacitor 3 determined by means of another transistor $Q_K2$, the latter being controlled by a third transistor $Q_K3$ controlled by a digital output signal $V_{CK}$ originating from the microcontroller 5.

The command originating from the microcontroller 5 is transformed into current $I_{CK}$ controlled by $Q_K3$ and $R_K5$. This current $I_{CK}$ has a small value so as to not interfere with the ultracapacitors 3 that are not intended to be affected by the discharge resulting from the active balancing.

Each ultracapacitor 3 can thus be individually discharged by being shunted with a resistor $R_K1$ as a consequence of the sending of a logic signal $V_{CK}$ coming from the microcontroller 5.

In this way, the charge voltage of an ultracapacitor 3 having a voltage greater than that of the other ultracapacitors 3 of the same module may be discharged in order to carry out an intra-module balancing.

Typically there will be not one module but several modules, in various series or parallel or series/parallel connections. The microcontroller 5 of a module 4 communicates with another module connected in series or in parallel with the module 4 by means of the optocoupler 8 which allows for a galvanic isolation of the communication between modules.

The microcontroller 5 may thus take into account the voltage at the terminals of an adjacent module which is communicated to it, so as to balance the voltage at the terminals of the module 4 as compared with the voltage of the adjacent module.

A lower charge voltage measured at the terminals of another module thus causes the charge voltage at the terminals of module 4 to be lowered by means of the command of the microcontroller 5 of the electronic board 2 of the module 4. In this way, the voltage of the series string of ultracapacitors 3 of module 4 may be lowered in order to carry out an inter-module balancing.

This permits balancing of the ultracapacitors 3 between each other inside the module 4, and permits balancing the modules between each other.

Typical modules may have have strings of anywhere from 6 to 32 ultracapacitors 3 connected in series.

Measurement of relative capacitances. The device 1 as described above, keeps track of which capacitors have smaller capacitance and which have greater capacitance, and it discharges only the capacitors having smaller capacitance, doing so only when such capacitors are at (or are approaching) high voltage. It does so independent of where the module is in a voltage charge/discharge cycle. The dissipated energy is thus no greater than that which is strictly necessary to carry out the balancing.

The alert reader will, however, appreciate that for this type of balancing, it is necessary to know the relative capacitance of each ultracapacitor 3 of the module 4 as compared with its neighbors in the series string of cells.

Two distinct algorithms will now be discussed, each of which is thought to be helpful toward a goal of working out the relative capacitances.

A first algorithm. A first algorithm for estimating this relative capacity of each of the cells is based on an analysis of the of the voltages at the terminals of each ultracapacitor 3, at various times.

Figure 4:
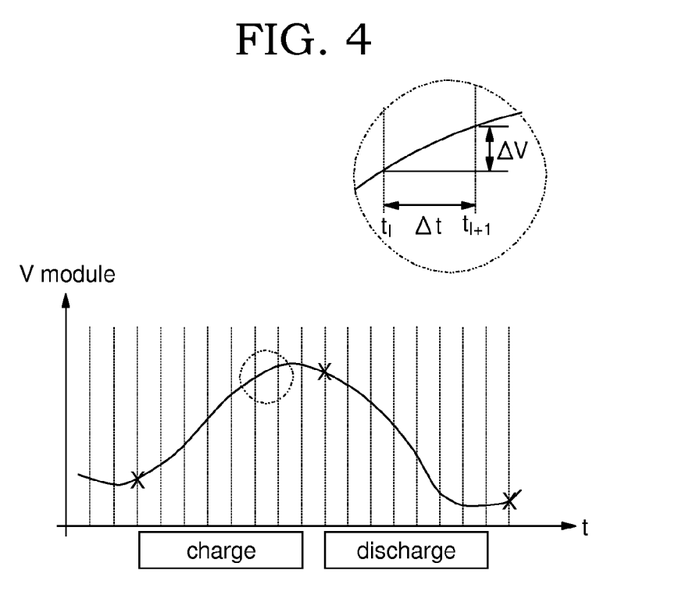
FIG. 4 shows a graph illustrating one algorithm on which the microcontroller may be based to control the charge and discharge of an ultracapacitor.

FIG. 4 shows the measured voltage at the terminals of a module 4 (here denoted $V_{MODULE}$ on the vertical axis) over the time of a charge and discharge cycle (sometimes called a life cycle), the flow of time portrayed on the horizontal axis.

The acquisition of the voltage of the module 4 is carried out at a frequency comprised between 10 Hz and 100 Hz. By this is meant that sampling takes place between ten times per second and one hundred times per second.

Such sampling having taken place, $\Delta V_i$ and the slope $\Delta V_i/\Delta t_i$ are calculated. At times when this ratio is positive, this means that the module 4 is being charged, and at times when this ratio is negative, this means that the module 4 is being discharged.

A cycle of charge or discharge is validated for the measurement of the capacity if, and only if:

$\Delta V_i/\Delta t_i < RI$, RI being a constant calculated from the total capacity of the module 4 and which corresponds to a current level that is sufficiently low to obtain a reliable measurement, and the voltage amplitude of the cycle is greater than a threshold comprised between 0.5 and 1V per ultracapacitor 3.

Under these conditions, the relative capacity of each of the ultracapacitors 3 of a particular module 4 is calculated by the formula:

$$C_{SC_k} = \frac{|\Delta V_i/\Delta t_i|_k}{|\Delta V_i/\Delta t_i|_{module}}$$

A second algorithm drawing upon measured relative capacitances. In another embodiment of the invention, an estimate is arrived at of the respective relative capacitance of each capacitor by means of measurements of voltages at each of the capacitors. A first capacitor in the series module is identified as having an estimated relative capacitance smaller than the estimated relative capacitance of a second capacitor in the series module. The first capacitor is caused to be charged to a respective level of charge lower than the respective level of charge of the second capacitor. It is hoped that the service life of the smaller-capacitance capacitor may be extended thereby. As in other examples herein, the capacitors may be ultracapacitors.

One way to achieve the result of causing the first capacitor to be charged to a respective level of charge lower than the respective level of charge of the second capacitor can be connecting a resistor to the first capacitor for some duration, thereby reducing the charge of the first capacitor.

It may be helpful to explain how an estimate of the respective relative capacity of each capacitor may be arrived at. In an exemplary sequence of steps, this is done by means of measurements of voltages at each of the capacitors and in particular is done by carrying out a multiplicity of relative capacity measurements and averaging the relative capacity measurements.

A relative capacity measurement may be carried out by performing the steps of:

at a first time when the current passing through the module is at a value smaller than a first predetermined threshold, measuring the respective voltage at each of the capacitors, thereby defining a sum of the voltages representing a voltage across the series module;

at a second time, after the current passing through the module has exceeded the first predetermined threshold and has later dropped to a value smaller than the first predetermined threshold, again measuring the respective voltage at each of the capacitors, thereby again defining a sum of the voltages representing a voltage across the series module;

for each capacitor, a difference between the respective voltage at the first time and the respective voltage at the second time defining a respective voltage change;

for the series array, a difference between voltage across the series module at the first time and the voltage across the series module at the second time defining a respective voltage change for the series module;

for each capacitor, a ratio of its respective voltage change to the voltage change in the series module defining the each relative capacity measurement.

It is thought preferable to avoid carrying out the activity of causing the first capacitor to be charged to a respective level of charge lower than the respective level of charge of the second capacitor at times when measurements of voltages take place. Stated differently, it is thought preferable to avoid carrying out the measurements of voltages at times when the step of causing the first capacitor to be charged to a respective level of charge lower than the respective level of charge of the second capacitor is taking place. In plainer language, it is thought preferable to avoid sampling when balancing is taking place, or to avoid balancing when sampling is taking place.

It may be helpful to explain why the voltage measurements are carried out during times when the current through the series array is relatively small. The insight is that the capacitors each have an internal resistance. If the current were high at the time of voltage measurements, then the IR drop across the internal resistances would throw off the voltage readings. So it is thought preferable to carry out the voltage measurements at times when currents are relatively small.

So far as this algorithm is concerned, it will be appreciated that one way to accomplish the voltage measurements is by using a multiplexer (the role of some of the circuitry in box 10 in FIG. 1) to selectively connect each of the capacitors, one by one, to analog circuitry such as is shown in FIG. 2 which in turn passes to an analog-to-digital input AN1 in FIG. 1.

Figure 5:
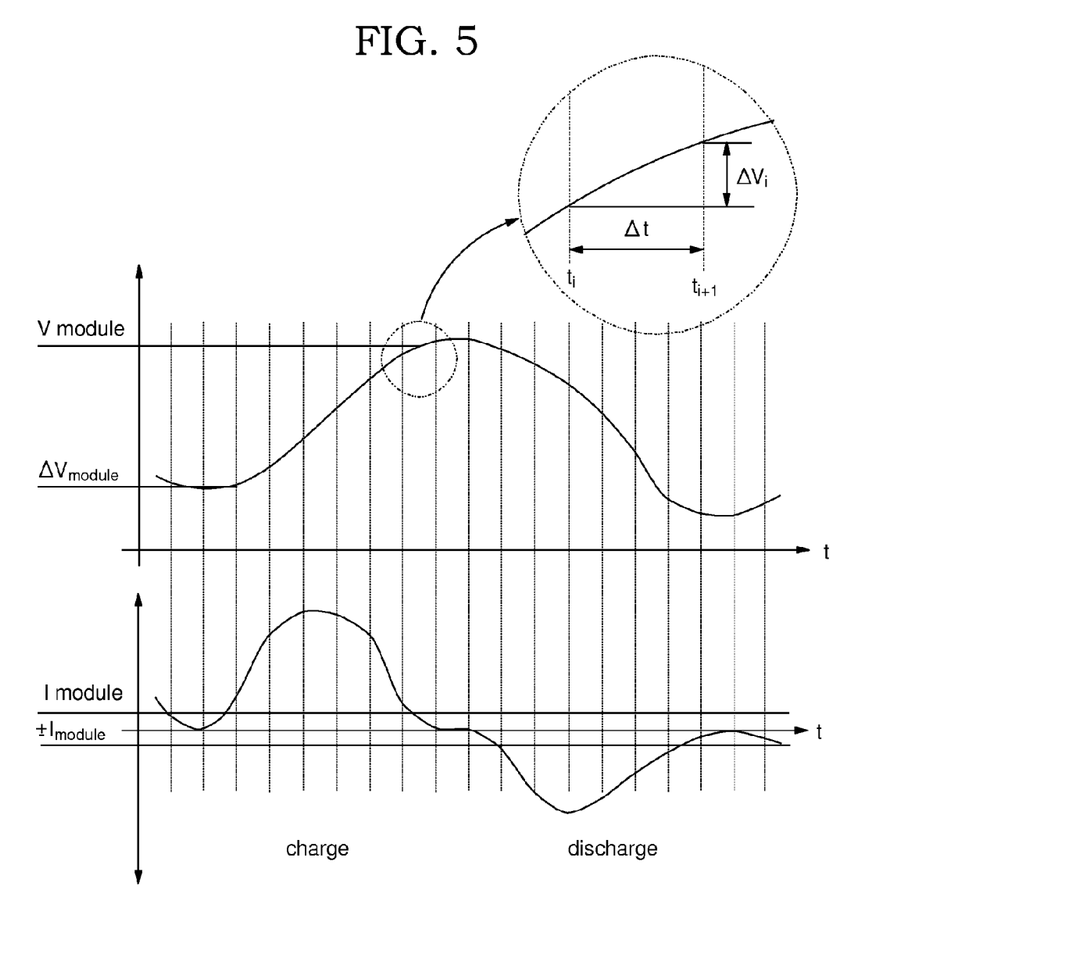
FIG. 5 shows a graph illustrating a second algorithm on which the microcontroller may be based to control the charge and discharge of an ultracapacitor.

Turning now to FIG. 5, this algorithm will be described pictorially.

A top vertical axis describes the voltage across an entire module (meaning the voltage across a series string of capacitors).

A lower vertical axis describes the current through the module during charge or discharge.

A horizontal axis shows the passage of time, through a charging interval and later through a discharge interval.

It will be appreciated that because the storage is in capacitors, whose voltage over a considerable range is linearly related to stored charge, then the lower curve (current) is roughly a first time derivative of the upper curve (voltage). Saying the same thing differently, the upper curve (voltage) is roughly an integral or "area under the curve" as to the lower curve (current).

On the lower vertical axis, there is shown a predetermined threshold for currents that are relatively small, slightly above or below a zero current. This interval relates to the just-mentioned situation namely that it is desired to carry out the voltage readings at times when the IR drops within the capacitors are relatively small.

The circled region at the upper curve (expanded for clarity) shows a delta-V measurement taken at a time when the current through the module is relatively small (as shown on the lower curve). This delta-V value (over a time interval delta-t) is measured for a particular cell in the series array of cells. Importantly, very soon before or after (or both), similar delta-V values are measured for the other cells in the series array of cells. These delta-V values are summed to arrive at a total voltage across the entire series array.

In an exemplary apparatus, each cell voltage measurement will take 150 microseconds. With a typical series string of cells of (say) 18 cells, this means that the 18 measurements can be accomplished in around 3 milliseconds.

Relative capacitance measurement can be discussed in greater detail. It will be appreciated that reduced to its essence, the calculation is based on a variation of voltage at the terminals of the module, compared to the cell voltage.

For cell n in the module, assuming for example 17 cells in the module, then the relative capacitance $C_n$ (expressed as a percentage of the average capacitance of all of the cells) is $$C_n[\%]=\Delta(V_{mobile}/17)/\Delta V_n$$

where $V_{module}$ is the voltage at the terminals of the module, and $V_n$ is the cell voltage for cell n.

To obtain a valid voltage measurement, we apply the following criteria:

$$\Delta V_{module} > 0.5V*17 = 8.5V$$

$$|I_{module}| < 7 A$$

The first criterion is motivated by the goal that each cell will have changed its voltage by at least half a volt. Again assuming 17 cells per module, this means that the $\Delta V$ for the module will have exceeded 8.5 volts.

The second criterion is motivated by the goal that at the time of voltage sampling, the (absolute value of) current through the module will not have exceeded 7 Amperes.

Assuming a capacitance of each capacitor of 176 Farads, and assuming a time interval $\Delta t$ of 1 second, then the measurement of current <7 A means that $\Delta V_{module} < 40$ mV.

It will be appreciated that one of the inputs to the relative-capacitance calculation can be the total voltage across the string. This raises the question whether it is required that the apparatus include some means for measuring the entire voltage across the entire string. While it would be possible to set up the apparatus to measure the voltage across the entire string separately, it should be more than adequate simply to add up the voltages across the individual cells to arrive at the voltage across the entire string.

The algorithm is described with respect to the relative capacitance of each of the capacitors in the string. It will be appreciated that this (mere relative capacitance) is more than enough to permit choosing which capacitors to "bleed" so as to reduce the risk of being charged to too-high a voltage. Having said this, in some apparatus an accurate current measurement may also be available, measuring the current through the string. If so, then coulometry may be possible. This, together with accurate voltage measurements, will permit measuring or at least estimating the actual (or "absolute") capacitances of the various capacitors in the string. In that event the absolute capacitances can likewise be employed to permit choosing which capacitors to "bleed" so as to reduce the risk of being charged to too-high a voltage. If this is done, it will be appreciated that the relative values of two absolute capacitances can be understood to provide relative capacitances and the procedures just described can be carried out mutatis mutandis, thereby providing the same life-extending benefits for particular capacitors.

Still another approach for extending life of a module becomes possible if a reliable current sensor is available for the module. This approach draws upon a service-life model that assumes that high current through a module may degrade its service life. Assuming this model, then the protective step is to lower or limit the voltage across the module (across the series string of capacitors) whenever possible at times when high currents (currents exceeding some threshold) are detected.

A more sophisticated variant of this approach is to define a space of currents and voltages, and to lower or limit the voltage across the module when any of particular combinations of current and voltage are encountered.

Temperature measurements and extending lives of cells. In another embodiment of the invention, the temperature of each capacitor in a series module is measured. A first capacitor in the series module is identified having a temperature higher than the temperature of a second capacitor in the series module. The first capacitor is caused to be charged to a respective voltage lower than the respective voltage of the second capacitor. As mentioned above one way to do this is by connecting a resistor to the first capacitor for some duration, thereby reducing the voltage of the first capacitor. As in other examples herein, the capacitors may be ultracapacitors. It is hoped that the service life of the warmer capacitor may be extended thereby.

A variant of this approach is applied to a plurality of series modules of capacitors, each module having a respective temperature. The temperature of each module is measured. A first module is identified having a temperature higher than the temperature of a second module. The first module is caused to be charged to a respective voltage lower than the respective voltage of the second module. This might be accomplished by connecting a resistor to the first module for some duration, thereby reducing the voltage of the first module. More elegantly, this may be accomplished by applying a smaller charging current to the first module than to the second module, or by applying a charging current to the first module for a shorter duration than to the second module. As in other examples herein, the capacitors may be ultracapacitors. It is hoped that the service life of the warmer module may be extended thereby.

The alert reader, having read the present document, will have no difficulty devising myriad obvious improvements and variations of the invention, all of which are intended to be encompassed within the claims which follow.

What is claimed is:

1. A method for use in a series module of capacitors, each capacitor having a respective relative capacitance, each capacitor at a particular moment having a respective charge, each capacitor at a particular moment having a respective voltage, the method comprising:

arriving at an estimate of the respective relative capacitance of each capacitor by measuring voltages at each of the capacitors;

identifying a first capacitor in the series module having an estimated relative capacitance smaller than the estimated relative capacitance of a second capacitor in the series module; and causing the first capacitor to be charged to a respective level of charge lower than the respective level of charge of the second capacitor.

2. The method of claim 1 wherein of causing the first capacitor to be charged to a respective level of charge lower than the respective level of charge of the second capacitor comprises connecting a resistor to the first capacitor for some duration, thereby reducing the charge of the first capacitor.

3. The method of claim 1 wherein the capacitors are ultracapacitors.

4. The method of claim 1 wherein the series module at a particular moment has a respective current passing therethrough, the respective current at various times defining positive, negative, and zero values, and arriving at an estimate of the respective relative capacitance of each capacitor by measuring voltages at each of the capacitors comprises carrying out a multiplicity of relative capacity measurements and averaging the relative capacity measurements, each relative capacity measurement comprises:

at a first time when the current passing through the series module is at a value smaller than a first predetermined threshold, measuring the respective voltage at each of the capacitors, thereby defining a sum of the voltages representing a voltage across the series module;

at a second time, after the current passing through the series module has exceeded the first predetermined threshold and has later dropped to a value smaller than the first predetermined threshold, again measuring the respective voltage at each of the capacitors, thereby again defining a sum of the voltages representing a voltage across the series module;

for each capacitor, a difference between the respective voltage at the first time and the respective voltage at the second time defining a respective voltage change;

for the series module, a difference between voltage across the series module at the first time and the voltage across the series module at the second time defining a respective voltage change for the series module;

for each capacitor, a ratio of its respective voltage change to the voltage change in the series module defining the each relative capacity measurement.

5. The method of claim 1 wherein causing the first capacitor to be charged to a respective level of charge lower than the respective level of charge of the second capacitor is not performed at any of the times when measurements of voltages take place.

6. The method of claim 1 wherein the measurements of voltages take place only at times when the first capacitor is not caused to be charged to a respective level of charge lower than the respective level of charge of the second capacitor.

7. An apparatus for use with a series module of capacitors, each capacitor having a respective relative capacitance, each capacitor at a particular moment having a respective charge, each capacitor at a particular moment having a respective voltage, the apparatus comprising:

means for arriving at an estimate of the respective relative capacitance of each capacitor by measuring voltages at each of the capacitors;

means for identifying a first capacitor in the series module having an estimated relative capacitance smaller than the estimated relative capacitance of a second capacitor in the series module; and means for causing the first capacitor to be charged to a respective level of charge lower than the respective level of charge of the second capacitor.

8. The apparatus of claim 7 wherein the means for causing the first capacitor to be charged to a respective level of charge lower than the respective level of charge of the second capacitor comprises a resistor selectively connectable to the first capacitor, thereby reducing the charge of the first capacitor.

9. The apparatus of claim 7 wherein the capacitors are ultracapacitors.

10. The apparatus of claim 7 wherein the series module at a particular moment has a respective current passing therethrough, the respective current at various times defining positive, negative, and zero values, the means for arriving at an estimate of the respective relative capacity of each capacitor by measuring voltages at each of the capacitors comprises means for carrying out a multiplicity of relative capacity measurements and averaging the relative capacity measurements, each relative capacity measurement comprises:

at a first time when the current passing through the series module is at a value smaller than a first predetermined threshold, measuring the respective voltage at each of the capacitors, thereby defining a sum of the voltages representing a voltage across the series module;

at a second time, after the current passing through the series module has exceeded the first predetermined threshold and has later dropped to a value smaller than the first predetermined threshold, again measuring the respective voltage at each of the capacitors, thereby again defining a sum of the voltages representing a voltage across the series module;

for each capacitor, a difference between the respective voltage at the first time and the respective voltage at the second time defining a respective voltage change;

for the series module, a difference between voltage across the series module at the first time and the voltage across the series module at the second time defining a respective voltage change for the series module;

for each capacitor, a ratio of its respective voltage change to the voltage change in the series module defining the each relative capacity measurement.

11. The apparatus of claim 7 wherein the means for causing does not cause the first capacitor to be charged to a respective level of charge lower than the respective level of charge of the second capacitor at any time when the measuring voltages take place.

12. The apparatus of claim 7 wherein the means for arriving measures the voltages at times when the means for causing is not causing the first capacitor to be charged to a respective level of charge lower than the respective level of charge of the second capacitor.

* * * * *

UNITED STATES PATENT AND TRADEMARK OFFICE
CERTIFICATE OF CORRECTION

PATENT NO. : 9,209,653 B2
APPLICATION NO. : 13/806085
DATED : December 8, 2015
INVENTOR(S) : Maynard et al.

It is certified that error appears in the above-identified patent and that said Letters Patent is hereby corrected as shown below:

In the Claims

In column 11 at line 13, In Claim 2, after "wherein" delete "of".

Signed and Sealed this
Twenty-sixth Day of July, 2016

Michelle K. Lee
*Director of the United States Patent and Trademark Office*